(12) United States Patent
Kil et al.

(10) Patent No.: US 6,849,300 B2
(45) Date of Patent: Feb. 1, 2005

(54) METHOD FOR FORMING HIGH DIELECTRIC LAYERS USING ATOMIC LAYER DEPOSITION

(75) Inventors: Deok-Sin Kil, Kyoungki-do (KR); Hyuk-Kyoo Jang, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 157 days.

(21) Appl. No.: 10/287,087

(22) Filed: Nov. 4, 2002

(65) Prior Publication Data

US 2003/0113480 A1 Jun. 19, 2003

(30) Foreign Application Priority Data

Dec. 10, 2001 (KR) .................................. 10-2001-77804

(51) Int. Cl.$^7$ .............................................. C23C 16/40
(52) U.S. Cl. ............................ 427/255.31; 427/255.36; 427/576
(58) Field of Search ....................... 427/255.31, 255.36, 427/576

(56) References Cited

U.S. PATENT DOCUMENTS

| | | | |
|---|---|---|---|
| 5,300,455 A | 4/1994 | Vuillermoz et al. | |
| 5,376,591 A | 12/1994 | Maeda et al. | |
| 5,939,131 A | 8/1999 | Kim et al. | |
| 5,970,384 A | 10/1999 | Yamazaki et al. | |
| 5,972,430 A * | 10/1999 | DiMeo et al. | 427/255.32 |
| 6,008,124 A | 12/1999 | Sekiguchi et al. | |
| 6,214,714 B1 | 4/2001 | Wang et al. | |
| 6,284,655 B1 * | 9/2001 | Marsh | 438/681 |
| 6,482,740 B2 * | 11/2002 | Soininen et al. | 438/686 |
| 6,503,561 B1 * | 1/2003 | Senzaki et al. | 427/226 |

* cited by examiner

*Primary Examiner*—Bret Chen
(74) *Attorney, Agent, or Firm*—Marshall, Gerstein & Borun LLP

(57) ABSTRACT

A method for manufacturing semiconductor device is disclosed which forms a high dielectric layer using atomic layer deposition (ALD). The method for forming a high dielectric layer having a first metal element, a titanium atom and an oxygen atom includes: on a surface of a substrate, adsorbing a first organic source combining a ligand, wherein the ligand includes at least oxygen and C—H combination in the first metal element; forming an atomic layer of the first metal element and the oxygen by inducing reduction reaction of the first organism source and a $NH_3$ gas, which are adsorbed on the surface of the substrate; adsorbing a second organism source combining a ligand, wherein the ligand includes at least oxygen and C—H combination on the titanium; and forming an atomic layer of the titanium and the oxygen by inducing reduction reaction of the second organism source and the $NH_3$ gas, which are adsorbed on the surface of the substrate.

25 Claims, 2 Drawing Sheets

METHOD FOR FORMING HIGH DIELECTRIC LAYERS USING ATOMIC LAYER DEPOSITION

TECHNICAL FIELD

A method for manufacturing semiconductor device and, more particularly, a method for forming high dielectric layers using an atomic layer deposition (ALD) is disclosed.

DESCRIPTION OF THE RELATED ART

With high integration of a semiconductor device, a conventional capacitor based on a $Si_3N_4$ layer and a $SiO_2$ layer (so-called, an NO structure) is limited in its ability to acquire a sufficient capacitance per unit area. Accordingly, to obtain a capacitance per unit area, research has been conducted for increasing the surface area of a charge storage electrode. However, because of the reduction of a process margin accompanied with high integration, there exists a limit in increasing surface area of the charge storage electrode.

For overcoming the above-mentioned limit, an interest in a method for manufacturing a high dielectric capacitor, which uses high dielectric materials, such as $SrTiO_3$ (hereinafter, referred to STO), $BaTiO_3$ (hereinafter, referred to as BTO) and $(Ba, Sr)TiO_3$ (hereinafter, referred to as BST), etc., as a capacitor dielectric layer, is increased.

The capacitance of a capacitor is proportioned to the dielectric constant of the capacitor dielectric layer.

Generally, a process for forming a capacitor including a high dielectric layer is similar to a process for forming a capacitor including a usual NO layer; however it is different from such a normal process, in case of forming the capacitor including the high dielectric layer comprises a high-level processes, such as a thin film deposition technique for obtaining superior high dielectric characteristic and a pre or post treatment technique for preventing the electrical characteristic deterioration of the capacitor and etc.

Meanwhile, when high dielectric layers, i.e., STO, BTO and BST are deposited with a usual chemical vapor deposition (CVD), a reliable high dielectric layer may not be obtained because of contamination generated by source material and etc., so an atomic layer deposition (ALD), which uses a surface chemical reaction, is normally used.

The ALD process will be described below. A source vapor containing an αelement is injected into a chamber and chemically adsorbed on a surface of a substrate on which a layer to be deposited, and the remnant of the source vapor is purged by injecting an inert gas, such as Ar and $N_2$, etc. Thereafter, a source vapor containing a βelement is injected, and a unit layer including the αelement and the βelement is grown by the surface reaction of the βelement and the source material which is already adsorbed on the substrate. Then, the remnant source vapor and by-products are purged by an inert gas, such as Ar and $N_2$, etc. The above-mentioned process is made for one cycle, and the many cycles are repeated until a required layer thickness is obtained.

In case of conventional STO layer formation process using ALD, a required thickness of STO layer is deposited by repeating cycles comprising steps of: a) supplying a Sr source vapor, purging it and supplying a $H_2O$ vapor as an oxygen source; purging it and supplying a Ti source vapor; c) purging it supplying a $H_2O$ vapor as an oxygen source; and d) purging it with maintaining the substrate to a predetermined temperature.

In the above case, because of a condensation characteristic of the $H_2O$ vapor supplied as an oxygen source, the remnant of $H_2O$ vapor is not removed completely in the purging step, and the remnant of $H_2O$ vapor reacts with the Sr source vapor or the Ti source vapor and generates reaction products, which are not required. The reaction products generated by the remnant of $H_2O$ vapor is contained in a layer to be deposited and acts as impurities, so that reliability of the STO layer is decreased.

Meanwhile, in case of forming BTO and BST layers with ALD, the $H_2O$ vapor is also used as the oxygen source, so the above-described problem is not only occurred with the STO layer, but also with BTO and BST layers.

SUMMARY OF THE DISCLOSURE

A method for forming high dielectric layer of a semiconductor device capable of preventing impurities from a $H_2O$ vapor used as an oxygen source is disclosed.

In accordance with one embodiment, a method is disclosed for forming a high dielectric layer having a first metal element, a titanium element and an oxygen element. The method comprises: preparing a substrate having a predetermined lower structure; performing a reaction process for a first organic source being absorbed to the substrate, wherein the first organic source includes the first metal element to which a ligand is combined, and wherein the ligand includes a C—H bond and an oxygen; forming an atomic layer of the first metal element and the oxygen element by inducing reduction and oxidation between the first organic source and a $NH_3$ gas; performing a reaction process for a second organic source being adsorbed onto the atomic layer, wherein the second organic source includes the titanium element to which a ligand is combined, and wherein the ligand includes a C—H bond and an oxygen; and forming an atomic layer of the titanium element and the oxygen element by inducing reduction and oxidation between the second organic source and a $NH_3$ gas.

In accordance with another embodiment, another method for forming a high dielectric layer having a first metal element, a titanium element and an oxygen element is disclosed. This method comprises: preparing a substrate having a predetermined lower structure; performing a reaction process for a first organic source being adsorbed onto the substrate, wherein the first organic source includes the first metal element to which a ligand is combined, and wherein the ligand includes a C—H bond; forming an atomic layer of the first metal element and the oxygen element by inducing reduction and oxidation between the first organic source and a plasma produced by $H_2$ gas and $H_2$ gas; performing a reaction process for a second organic source being absorbed to the atomic layer, wherein the second organic source includes the titanium element to which a ligand is combined, and wherein the ligand includes an oxygen; and forming an atomic layer of the titanium element and the oxygen element by inducing reduction and oxidation between the second organic source and a plasma produced by $H_2$ gas and $H_2$ gas.

In accordance with still another embodiment, another method for forming a high dielectric layer having a first metal element, a titanium element and an oxygen element is disclosed. This method comprises: preparing a substrate having a predetermined lower structure; performing a reaction process for a first organic source being adsorbed onto the substrate, wherein the first organic source includes the first metal element to which a ligand is combined, and wherein the ligand includes a C—H bond; forming an atomic layer of the first metal element and the oxygen element by inducing combustion between the first organic source and an oxygen atom; performing a reaction process for a second organic source being absorbed to the atomic layer, wherein the second organic source includes the titanium element to which an alkoxide ligand is combined; and forming an atomic layer of the titanium element and the oxygen element by inducing combustion between the first organic source and an oxygen atom.

In accordance with further still another embodiment, another method for forming a high dielectric layer having a first metal element, a titanium element and an oxygen element is disclosed. This method comprises: preparing a substrate having a predetermined lower structure; performing a reaction process for a first organic source being adsorbed onto the substrate, wherein the first organic source includes the first metal element to which a ligand is combined, and wherein the ligand includes a C—H bond; forming an atomic layer of the first metal element and the oxygen element by inducing combustion between the first organic source and an oxygen atom; performing a reaction process for a second organic source being absorbed to the atomic layer, wherein the second organic source includes the titanium element to which an alkoxide ligand is combined; and forming an atomic layer of the titanium element and the oxygen element by inducing combustion between the first organic source and an oxygen atom.

Three methods are disclosed for obtaining an oxide layer. First, an oxide is layer obtained by removing a ligand except oxygen combined with a center metal (Sr or Ba) by a reduction reaction using a $NH_3$ gas.

Second, an oxide layer of a central metal is obtained at a low temperature by an oxidation reaction using plasma of $O_2$ gas and a reduction reaction using plasma of an $H_2$ gas.

Third, an oxide layer of a central metal is obtained by removing C and H combined with the central metal, through a combustion reaction with an $O_3$ gas, plasma of a $N_2O$ gas or plasma of $O_2$ gas providing oxygen atom showing excellent reaction kinetics.

BRIEF DESCRIPTION OF THE DRAWINGS

Other aspects of the disclosed methods will become apparent from the following description with reference to the accompanying drawings, wherein.

DETAILED DESCRIPTION OF THE PRESENTLY PREFERRED EMBODIMENTS

Hereinafter, a method for forming high dielectric layer using atomic layer deposition will be described in detail referring to the accompanying drawings.

A first embodiment provides a method for forming a $SrTiO_3$ (STO) layer with an atomic layer deposition (ALD) method using an $NH_3$ gas.

Referring to the first embodiment, a substrate including a conductive layer for bottom electrode is loaded in a reactor equipping a pump for vacuum out, and then the substrate is heated to a predetermined temperature ranging from about 200° C. to about 400° C.

As a Sr source material, $Sr(TMHD)_2$ is flowed into the reactor the reactor for predetermined time ranging from about 0.1 to about 10.0 seconds, and the Sr source material is adsorbed onto a surface of a substrate. At this time, a β-diketonate ligand or a cyclopenta ligand combined to a central Sr atom, may be used as the Sr source material. Also, a solution in which the β-diketonate ligand or the cyclopenta ligand combined to a central Sr atom is dissolved in a solvent, such as methanol, tertrahydrofuran (THE) and n-butylacetate, etc., is used as the Sr source material.

Figure 1A:
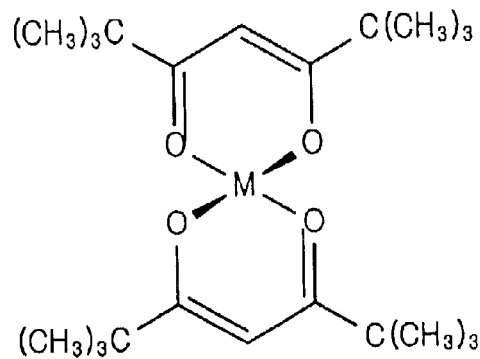
FIGS. 1A to 1C illustrate a structural formula of material comprising a β-diketonate ligand combined to a central Sr atom.
Figure 1B:
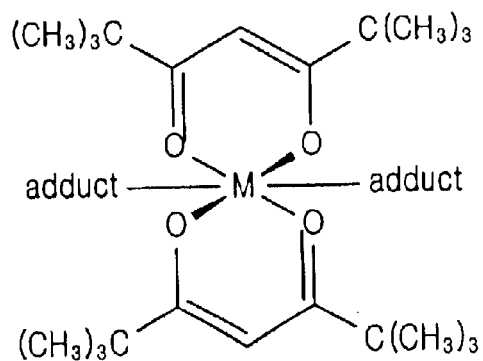
Figure 1C:
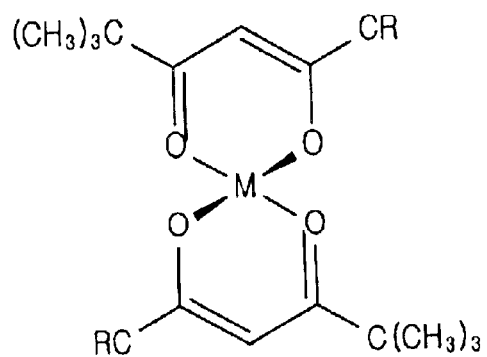
Figure 2:
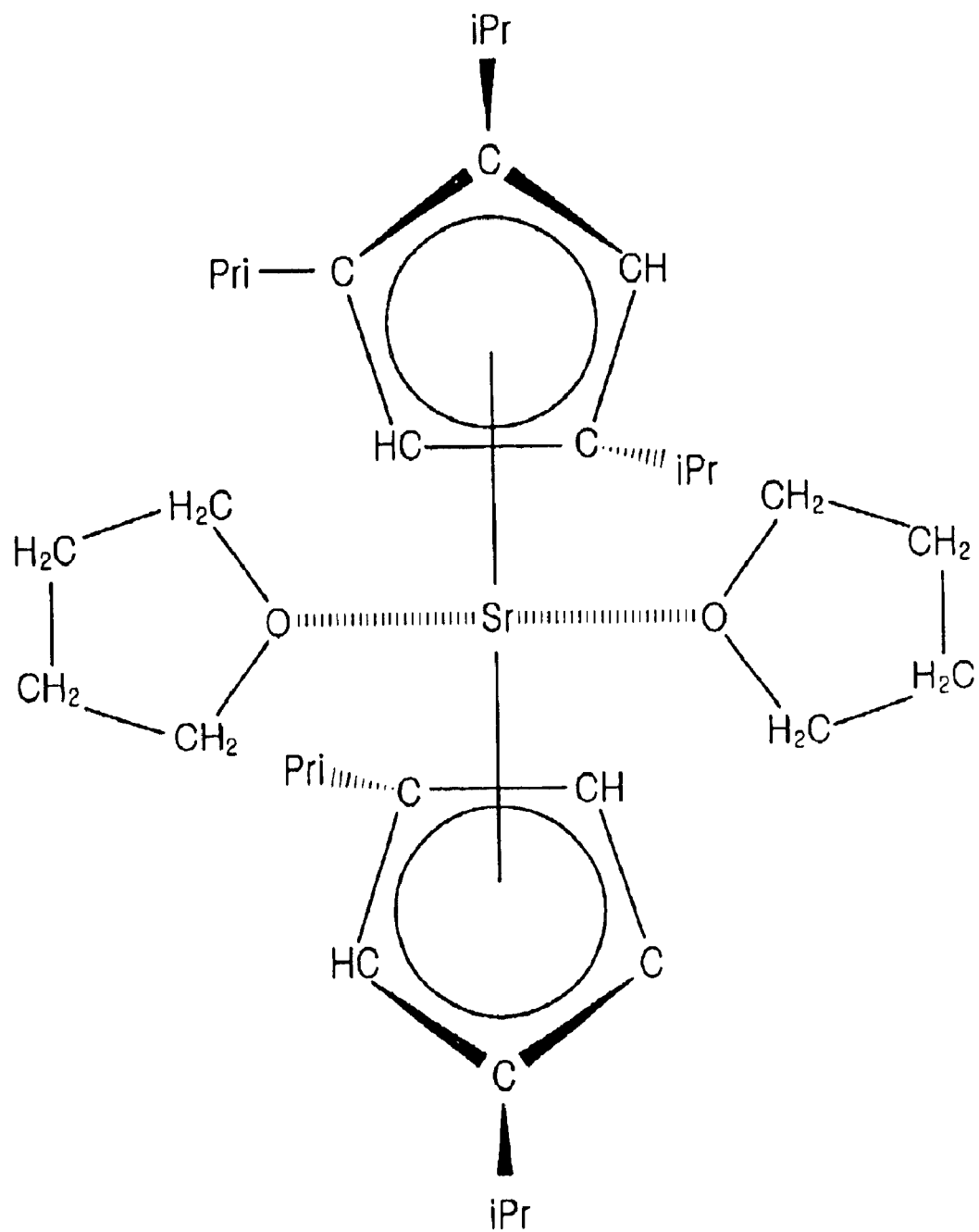
FIG. 2 is a structural formula of $Sr(C_5iPr_3H_2)_2(C_4H_8O)_2$ in a cyclopenta group.

FIGS. 1A to 1C are structural formulas of material having the β-diketonate ligand combined to the central Sr atom. FIG. 1A, denotes a structural formula of $Sr(TMHD)_2$, FIG. 1B denotes a structural formula of $Sr(TMHD)_2$ to which an adduct is bonded, and FIG. 1C denotes a structural formula of $Sr(TMHD)_2$ of which parts of$(CH_3)_3$ in tetramethylheptandionate (TMHD) are substituted with another ligand (R). In FIGS. 1A to 1C, "M" represents a central metal Sr. Meanwhile, as the adductive bonded to the material shown in FIG. 1B, a polyether-based materials, such as tryglyme and tetraglyme, or a polyamine-based material, such as pmdt, trine and tetraen may be used. FIG. 2 is a structural formula of $Sr(C_5iPr_3H_2)_2(THF)_2$ in a cyclopenta-based material, in FIG. 2 "iPr" represents $CH(CH_3)_2$.

After flowing $Sr(TMHD)_2$ as mentioned above, an inert gas, i.e. $N_2$ and Ar, etc., are flowed into the reactor for a predetermined time ranging from about 0.1 to about 5.0 seconds, or pumping out the reactor, in order to remove the Sr source material remaining after reaction.

Subsequently, an $NH_3$ gas is flowed into the reactor at a flow rate ranging from about 50 to about 300 sccm, in order to induce surface reaction between the $NH_3$ gas and the Sr source material adsorbed on the substrate.

The $NH_3$ gas is a revivify gas, which has very strong revivify characteristic, and the $NH_3$ gas cuts C—H and C—O combination of β-diketonate ligand and cyclopenta ligand, respectively, within a Sr source material, so that a Sr—O combination is remained on a surface of a substrate, and thereby to form SrO.

To remove a non-react $NH_3$ gas and a react by-product, an inert gas, i.e., $N_2$ and Ar, etc., are flowed into reactor for a predetermined time ranging from about 0.1 to about 5.0 seconds or vacuum purged, and then the inert gas are discharged through a pump.

After that, as a Ti source material, $Ti(OiPr)_4$ is flowed into reactor for a predetermined time ranging from about 0.1 to about 10.0 seconds so that the Ti source material is adsorbed on a surface of a substrate, whereby SrO is formed. At this time, as Ti source materials, an alkoxide group materials, such as the $Ti(OiPr)_4$ and $Ti(OEt)_4$, etc., and a β-diketonate material, such as $Ti(OiPr)_2 (TMHD)_2$ and $TiO (TMHD)_2$ are used. The Ti source material may be bubbled within a source instrument to provide the Ti source material within a reactor using an inert gas, such as Ar and $N_2$, etc., or after vaporizing an amount of controlled Ti source material using a liquid flow rater, it is inserted within a vaporizer, and then the Ti source material is provided within a reactor.

To remove a non-react Ti source material, an inert gas, i.e., $N_2$ and Ar, etc., are flowed into the reactor for a predetermined time ranging from about 0.1 to about 5.0 seconds or vacuum purged, and then the inert gas are discharged through a pump.

A $NH_3$ gas is flowed into the reactor at a flow rate ranging from about 50 to about 300 sccm to induce surface reaction with a Ti source material, which is adsorbed on a surface of a substrate. At this time, the $NH_3$ gas is reacted with a Ti source material and revivifying a propyl-radical (—$C_3H_7$) or an ethyl-radical (—$C_2H_5$) except Ti—O combination, and thereby to form $TiO_2$. A reaction mechanism of a Ti source material and a $NH_3$ gas are very similar to the above-described reaction mechanism of the Sr source material and the $NH_3$ gas. Meanwhile, a $NH_3$ gas may be flowed into the reactor with a Ti source material, and in this case, a decomposition of Ti source material is accelerated and a remaining of carbon impurity within a layer may be minimized. In this instance, a size of Ti source material molecular is being smaller by the $NH_3$ gas, so that a number of Ti molecular adsorbed on a surface of a substrate is increased, and thereby to increase deposition rate of the Ti source material.

To remove a non-react $NH_3$ gas and a react by-product, an inert gas, i.e., $N_2$ and Ar, etc., are flowed into the reactor for a predetermined time ranging from about 0.1 to about 5.0 seconds or vacuum purged, and then the inert gas are discharged through a pump.

An atomic layer is formed by performing the above-mentioned processes as one-cycle, and to obtain required thickness of STO layer, a number of the cycle is increased.

In accordance with the above-mentioned first embodiment, a ligand is revivified and removed except oxygen within Sr and a Ti source material using a $NH_3$ gas, which is very strong revivify gas, so that a STO layer may be formed without an additional oxygen source. Therefore, a generation of non-required by-product caused by $H_2O$, which is used as an oxygen source in a conventional method.

Besides, a $NH_3$ gas exists in a state of vapor at a room temperature, so it does not need a bubbler for supplying a source vapor such as $H_2O$, and heating of a gas supply line for removing a remnant $H_2O$ is not necessary, so a cost needed in a deposition device maintenance may be reduced. Meanwhile, in case of using $H_2O$ as an oxygen source according to a conventional method, there is frequently happened oxygen depletion defect within a layer. However, in the first embodiment, an additional oxygen source is not used and oxygen included within Sr and a Ti source material is used, and thereby to exclude a generation of oxygen depletion defect.

A second embodiment of the present invention is to form STO layer with ALD method using plasma produced from mixed gas of $H_2$ and $O_2$ mixed gas.

Referring to the second embodiment, a substrate formed a conductive layer for bottom electrode is loaded within a reactor equipping a discharge pump, and then maintaining the substrate to a predetermined temperature ranging from about 100° C. to about 350° C.

As a Sr source material, $Sr(TMHD)_2$ is flowed into the reactor about predetermined period ranging from about 0.1 to about 10.0 seconds to adsorb the Sr source material on a surface of a substrate. A β-diketonate ligand is combined with a Ba atom, which is a central metal, and the above-mentioned material may be used by dissolving in a solvent, such as methanol, THF and n-butyleacetate, etc.

To remove a non-react Sr source material, an inert gas, i.e., $N_2$ and Ar, etc., are flowed into the reactor for a predetermined time ranging from about 0.1 to about 5.0 seconds or vacuum purged, and then the inert gas are discharged through a discharge pump.

Subsequently, $H_2/O_2$ gas is flowed within a reactor and plasma is generated by applying RF power (50 W to about 300 W). At this time, $H_2/O_2$ gas is not flowed within a reactor, directly, and may be supplied in a remote plasma method from an external of a reactor. A $H^+$ radical supplied by plasma of a $H_2$ gas removes the whole β-diketonate ligand to H(TMHD) and ROH (R is an alkyl radical, and a material combining —OH radical to the R is generally called as an alcohol) formation to induce very clean ligand removing reaction. Also, plasma of an $O_2$ gas combined a little than that of the $H_2$ gas induces an oxidation reaction of a central metal Sr, which is divided with a ligand having oxygen, then an oxide layer is formed.

A reaction mechanism of generating H(tmdh) by a chemical reaction between plasma of $H_2$ and Sr source material will be described as follows:

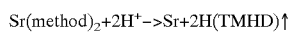

Equation 1

To remove a non-react plasma and react by-product, an inert gas, i.e., $N_2$ and Ar, etc., are into the reactor for a predetermined time ranging from about 0.1 to about 5.0 seconds or vacuum purged, and then the inert gas are discharged through a discharge pump.

After that, as a Ti source material, $Ti(OiPr)_2(TMHD)_2$ is flowed into a reactor about a predetermined time ranging from about 0.1 to about 10.0 seconds so that the Ti source material is adsorbed on a surface of a substrate where SrO is formed. At this time, as Ti source materials, a β-diketonate material, such as $Ti(OiPr)_2(TMHD)_2$, $TiO(TMHD)_3$ and $Ti(MPD)(TMHD)_2$, and an alkoxide group materials, such as the $Ti(OiPr)_4$ and $Ti(OEt)_4$, etc., are used.

To remove a non-react Ti source material, an inert gas, i.e., $N_2$ and Ar, etc., are into the reactor for a predetermined time ranging from about 0.1 to about 5.0 seconds or vacuum purged, and then the inert gas are discharged through a discharge pump.

Subsequently, using plasma of a $H_2/O_2$ gas, a ligand within a Ti source material is reduced and removed and $TiO_2$ is formed by oxidizing Ti. At this time, a reaction mechanism of plasma of a $H_2/O_2$ gas and a Ti source material are very similar to the above-described reaction mechanism of a $H_2/O_2$ gas and a Ti source material.

To remove a non-react plasma and a react by-product, an inert gas, i.e., $N_2$ and Ar, etc., are flowed into the reactor for a predetermined time ranging from about 0.1 to about 5.0 seconds or vacuum purged, and then the inert gas are discharged through a discharge pump.

The above-mentioned process is being a one cycle to form an atomic layer, and to the cycle is repeated until a required thickness of STO layer is obtained.

According to the above-mentioned the second embodiment, by a $H^+$ radical included within a $H_2$ gas, a ligand combined with Sr and Ti are reduced and decomposed by a clean reaction (refer to the Equation 1) at a temperature below decomposition of the source itself (in case of Sr, 100° C. to about 350° C. and in case of Ti, 100° C. to about 300° C.), and then a STO layer is formed by inducing an oxidation of Sr and Ti due to plasma of $O_2$ gas. Therefore, a not required generation of a by-product and an oxygen depletion defect caused by $H_2O$, which is used as an oxygen source in a conventional method, may be prevented. Meanwhile, in case of a conventional method, a reaction is formed at a temperature over $H_2O$ decomposition, but in the second embodiment of the present invention, a depletion process may be carried out in an enoughly low temperature due to a usage of plasma of $H_2$ gas.

A third embodiment of the present invention is form a STO layer with ALD method using plasma, such as $N_2O$, $O_2$ and $O_3$.

Referring to the first embodiment, a substrate formed a conductive layer for bottom electrode is loaded within a reactor equipping a discharge pump, and then maintaining the substrate to a predetermined temperature ranging from about 200° C. to about 400° C.

As a Sr source material, $Sr(TMHD)_2$ is flowed into the reactor about predetermined period ranging from about 0.1 to about 10.0 seconds to adsorb the Sr source material on a surface of a substrate. A β-diketonate ligand uses materials combined with a Sr atom, which is a central metal, or a cyclopenta ligand combined with Sr atom, which is a central metal, may be used and the above-mentioned material may be used by dissolving in a solvent, such as methanol, THF and n-butyleacetate, etc.

To remove a non-react Sr source material, an inert gas, i.e., $N_2$ and Ar, etc., are flowed into the reactor for a predetermined time ranging from about 0.1 to about 5.0 seconds or vacuum purged, and then the inert gas are discharged through a discharge pump.

Subsequently, an $O_3$ gas is flowed within a reactor to induce a surface reaction with a Sr source material, which is adsorbed a surface of a substrate. At this time, the $O_3$ is decomposed to provide $O_2$ and O, so, as described following equation 2, C and H within a ligand of a Sr source material is removed in a form of $CO_2$, CO and $H_2O$, etc., through a combustion reaction, and forms SrO by oxidizing Sr. Meanwhile, plasma of an $O_2$ or $N_2O$ gas is used instead of the $O_3$ gas, and an excite of plasma may be provided using RF within a reactor or as a remote plasma method from an external of a reactor. When an $O_2$ gas is excited with plasma, an $O_2^*$ (activating oxygen) and $O^{-2}$, etc., are generated, so the $O_2$ gas has a reaction mechanism as same as the equation 2, and a $N_2O$ gas also includes oxygen in an atom unit in a plasma condition, so the $N_2O$ gas also has a reaction mechanism such as a reaction 2.

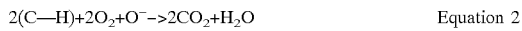

$$2(C-H)+2O_2+O^- \rightarrow 2CO_2+H_2O \quad \text{Equation 2}$$

To remove a non-react $O_3$ gas and a reaction by-product, an inert gas, i.e., $N_2$ and Ar, etc., are flowed into the reactor for a predetermined time ranging from about 0.1 to about 5.0 seconds or vacuum purged, and then the inert gas are discharged through a discharge pump.

After that, as a Ti source material, $Ti(OiPr)_4$ is flowed into a reactor about a predetermined time ranging from about 0.1 to about 10.0 seconds so that the Ti source material is adsorbed on a surface of a substrate where SrO is formed. At this time, as Ti source materials, an alkoxide group materials, such as the $Ti(OiPr)_4$ and $Ti(OEt)_4$, etc., are used.

To remove a non-react Ti source material, an inert gas, i.e., $N_2$ and Ar, etc., are flowed into the reactor for a predetermined time ranging from about 0.1 to about 5.0 seconds or vacuum purged, and then the inert gas are discharged through a discharge pump.

Subsequently, an $O_3$ gas is flowed into a reactor to induce a surface reaction with a Ti source material, which is adsorbed on a surface of a substrate. An alkoxide group materials, such as the $Ti(OiPr)_4$ and $Ti(OEt)_4$, etc., have a structure of oxygen is attached on an alkyl radical, i.e. Pr and Et, etc. When oxygen in an atom unit is supplied, the alkyl radical (R) is removed in a form of ether type of ROR. That is, a part of supplied oxygen in an atom unit removes OiPr and OEt from a source material, and remained oxygen plays a role of oxidizing Ti, which is a central metal.

To remove a non-react $O_3$ gas and a by-product, an inert gas, i.e., $N_2$ and Ar, etc., are flowed into the reactor for a predetermined time ranging from about 0.1 to about 5.0 seconds or vacuum purged, and then the inert gas are discharged through a discharge pump.

The above-mentioned process is being a one cycle and form an atomic layer, and the cycle is repeated until a required layer thickness of STO layer is obtained.

According to the above-mentioned third embodiment, a remnant of impurities, such as carbon, within a STO layer may be prevented due to an $O_3$ having high reacting and O plasma (refer to the Equation 2). Also, plasmas of $O_3$, $O_2$ and $N_2O$ commonly supplies oxygen in an atom unit within a reactor, so the plasma has excellent reacting with Sr and a Ti source material than that of a conventional $H_2O$, and the plasmas are not adsorbed within a reactor like $H_2O$, so an impurities generated by moisture when a long time atomic layer deposition is carried out, may be prevented. Successively, if the oxide source supply time is shorter than that of a conventional $H_2O$, a reaction is carried out rapidly, so a process time may be shortened.

In the above-mentioned embodiments, a STO layer formation using Sr and Ti source material is described as an example, but the technical principle may be adapted in a BST layer formation by supplying a Ba source material in a Sr source material supplying area. Ba and Sr are an alkaline-earth metal and they are chemically very similar, so a Sr source material group material may be used as a Ba source material.

The disclosed techniques may be adopted in forming a BST layer by supplying a cocktail source material, which a Sr source material and a Ba source material are mixed in a Sr source material supply area of the above-mentioned each embodiment.

The disclosed techniques may be adopted in forming a BST layer by repeating following two cycles after carrying out a first cycle in each embodiment and in a second cycle, supplying a Ba source material instead of a Sr source material.

Besides, a supplying sequence of an element, which comprises each high dielectric layer, is not affect to a formation of a layer and the sequence is not important matters.

In accordance with the above, in depositing a high dielectric layer, such as STO, BTO and SBT, etc., using the ALD, an non-wanted generation of a reaction byproduct may be prevented by excluding usage of $H_2O$, which is used as an oxygen source. Also the present invention has effects of preventing an oxygen depletion of a high dielectric layer according to a source supplied for an oxide formation, depositing a high dielectric layer in an enough low temperature and preventing an impurities and shortening a processing time.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a high dielectric layer comprising a first metal element, a titanium element and an oxygen element, the method comprising:

performing a reaction process to adsorb a first organic source onto a substrate, wherein the first organic source comprises the first metal element to which a ligand is combined, and wherein the ligand comprises a C—H bond and an oxygen;

forming an atomic layer of the first metal element and the oxygen element by inducing reduction and oxidation between the first organic source and a $NH_3$ gas;

performing a reaction process to adsorb a second organic source onto the atomic layer, wherein the second organic source includes the titanium element to which a ligand is combined, and wherein the ligand comprises a C—H bond and an oxygen; and forming an atomic layer of the titanium element and the oxygen element by inducing reduction and oxidation between the second organic source and a $NH_3$ gas.

2. The method of claim 1, wherein the first organic source is selected from the group consisting of a β-diketonate ligand combined with the first metal element and a cyclopenta ligand combined with the first metal element.

3. The method of claim 2, wherein the first metal element is Sr or Ba.

4. The method of claim 3, wherein the first organic source includes a material selected from the group consisting of $M(TMHD)_2$, a material having an additive attached to $M(TMHD)_2$ and $Sr(TMHD)_2$ wherein the Sr is substituted to another ligand, and wherein the M is Sr or Ba.

5. The method of claim 4, wherein the additive is a polyether group material or a polyamine group material.

6. The method of claim 4, wherein the $Sr(TMHD)_2$ substituted to another ligand is $Sr(C_5iPr_3H_2)_2$ $(THF)_2$.

7. The method of claim 2, wherein a substrate temperature is maintained from about 200° C. to about 400° C.

8. The method of claim 1, wherein the second organic source is selected from the group consisting of an alkoxide group ligand combined with the titanium and a β-diketonate ligand combined with the titanium.

9. The method of claim 8, wherein the second organic source is selected from the group consisting of $Ti(OiPr)_4$, $Ti(Oet)_4$, $Ti(OiPr)_2(TMHD)_2$ and $TiO(TMHD)_2$.

10. The method of claim 8, further comprising the steps of:

performing a reaction process to adsorb a third organic source onto the substrate on which the atomic layer of the titanium element and the oxygen element are formed, wherein the third organic source comprises a second metal element to which a ligand is combined, and wherein the ligand includes a C—H bond and an oxygen;

forming an atomic layer of the second metal element and the oxygen element by inducing reduction and oxidation between the third organic source and a $NH_3$ gas;

performing a reaction process to adsorb a fourth organic source onto the substrate on which the atomic layer of the second metal element and the oxygen element are formed, wherein the fourth oragnic source includes the titanium element to which the ligand is combined; and forming an atomic layer of the titanium element and the oxygen element by inducing reduction and oxidation between the fourth organic source and a $NH_3$ gas.

11. The method of claim 10, wherein the first metal element is Sr and the second metal element is Ba.

12. A method for forming a dielectric layer having a first metal element, a titanium element and an oxygen element, the method comprising:

performing a reaction process to adsorb a first organic source onto a substrate, wherein the first organic source comprises the first metal element to which a ligand is combined, and wherein the ligand comprises a C—H bond;

forming an atomic layer of the first metal element and the oxygen element by inducing reduction and oxidation between the first organic source and a plasma produced by $H_2$ gas and $H_2$ gas;

performing a reaction process to adsorb a second organic source onto the atomic layer, wherein the second organic source comprises the titanium element to which a ligand is combined, and wherein the ligand includes an oxygen; and forming an atomic layer of the titanium element and the oxygen element by inducing reduction and oxidation between the second organic source and a plasma produced by $H_2$ gas and $H_2$ gas.

13. The method of claim 12, wherein the first organic source is selected from the group consisting of a β-diketonate ligand combined with the first metal element and a cyclopenta ligand combined with the first metal element.

14. The method of claim 13, wherein the first metal element is Sr or Ba.

15. The method of claim 13, wherein a substrate temperature is maintained from about 100° C. to about 350° C.

16. The method of claim 12, wherein the second organism source is selected from the group consisting of an alkoxide group ligand combined with the titanium and a β-diketonate ligand combined with the titanium.

17. The method of claim 16, further comprising the steps of:

performing a reaction process to adsorb a third organic source onto the substrate on which the atomic layer of the titanium element and the oxygen element are fonned, wherein the third organic source comprises a second metal element to which a ligand is combined, and wherein the ligand comprises a C—H bond;

forming an atomic layer of the second metal element and the oxygen element by inducing reduction and oxidation between the third organic source and a plasma produced by $H_2$ gas and $H_2$ gas;

performing a reaction process to adsorb a fourth organic source onto the substrate on which the atomic layer of the second metal element and the oxygen element is formed, wherein the fourth oragnic source includes the titanium element to which the liaand is combined; and forming an atomic layer of the titanium element and the oxygen element by inducing reduction and oxidation between the second organic source and a plasma produced by $H_2$ gas and $H_2$ gas.

18. The method of claim 17, wherein the first metal element is Sr and the second metal element is Ba.

19. A method for forming a dielectric layer having a first metal element, a titanium element and an oxygen element, the method comprising the steps of:

performing a reaction process to adsorb a first organic source onto a substrate, wherein the first organic source comprises the first metal element to which a ligand is combined, and wherein the ligand comprises a C—H bond;

forming an atomic layer of the first metal element and the oxygen element by inducing combustion between the first organic source and an oxygen atom;

performing a reaction process to adsorb a second organic source onto the atomic layer, wherein the second organic source comprises the titanium element to which an alkoxide ligand is combined; and forming an atomic layer of the titanium element and the oxygen element by inducing combustion between the second organic source and oxygen.

20. The method of claim 19, wherein the atomic oxygen is obtained from $O_3$, plasma produced from $N_2O$ gas and plasma produced from $O_2$.

21. The method of claim 20, the first organic source includes the first metal element to which a material is combined, wherein the a material is selected from the group consisting of a β-diketonate ligand, and cyclopenta ligand.

22. The method of claim 21, wherein the first metal element is Sr or Ba.

23. The method of claim 22, wherein a substrate temperature is maintained from about 200° C. to about 400° C.

24. The method of claim 19 further comprising the steps of:

performing a reaction process to adsorb a third organic source onto the substrate on which the atomic layer of the titanium element and the oxygen element are formed, wherein the third organic source comprises a second metal element to which a ligand is combined, and wherein the ligand comprises a C—H bond and an oxygen;

forming an atomic layer of the second metal element and the oxygen element by inducing combustion between the third organic source and an oxygen atom;

performing a reaction process to adsorb a fourth organic source onto the substrate on which the atomic layer of the titanium metal element and the oxygen element are formed, wherein the fourth organic source includes the titanium element to which the ligand is combined; and forming an atomic layer of the titanium element and the oxygen element by inducing combustion between the fourth organic source and oxygen.

25. The method of claim 24, wherein the first metal element is Sr and the second metal element is Ba.

* * * * *

UNITED STATES PATENT AND TRADEMARK OFFICE
CERTIFICATE OF CORRECTION

PATENT NO. : 6,849,300 B2
DATED : February 1, 2005
INVENTOR(S) : Deok-Sin Kil et al.

It is certified that error appears in the above-identified patent and that said Letters Patent is hereby corrected as shown below:

Title page,
Item [73], Assignee, after "Hynix" please delete "Semiconductor," and insert
-- Semiconductor -- in its place.

Column 10,
Line 65, please delete "fonned," and insert -- formed -- in its place.

Column 11,
Line 8, after "the fourth" please delete "oragnic" and insert -- organic -- in its place.
Line 9, after "to which the" please delete "liaand" and insert -- ligand -- in its place.

Column 12,
Line 6, after "combined," please delete "wherein the a material" and insert -- wherein the material -- in its place.

Signed and Sealed this

Twelfth Day of July, 2005

JON W. DUDAS
*Director of the United States Patent and Trademark Office*